(12) United States Patent
Choi

(10) Patent No.: US 12,471,456 B2
(45) Date of Patent: Nov. 11, 2025

(54) COVER FILM AND A DISPLAY DEVICE INCLUDING THE SAME

(71) Applicant: SAMSUNG DISPLAY CO., LTD., Yongin-si (KR)

(72) Inventor: Hyunkyu Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 568 days.

(21) Appl. No.: 17/522,077

(22) Filed: Nov. 9, 2021

(65) Prior Publication Data
US 2022/0262887 A1    Aug. 18, 2022

(30) Foreign Application Priority Data
Feb. 15, 2021    (KR) ........................ 10-2021-0019819

(51) Int. Cl.
*H10K 59/131*    (2023.01)
*H01L 23/552*    (2006.01)
*H01L 23/60*    (2006.01)
*H10K 59/126*    (2023.01)
*H10K 59/80*    (2023.01)

(52) U.S. Cl.
CPC ......... *H10K 59/131* (2023.02); *H01L 23/552* (2013.01); *H01L 23/60* (2013.01); *H10K 59/126* (2023.02); *H10K 59/873* (2023.02)

(58) Field of Classification Search
CPC .... H10K 59/131; H10K 50/84; H10K 59/126; H10K 50/8426; H10K 2102/331; H10K 59/873; C09J 7/29; C09J 2301/122; H01L 27/156; H01L 27/124; H01L 23/60; H01L 23/552
See application file for complete search history.

(56) References Cited

U.S. PATENT DOCUMENTS

| 7,460,112 | B2 | 12/2008 | Yamada |
| 8,860,698 | B2 | 10/2014 | Yamada |
| 2005/0007354 | A1 | 1/2005 | Yamada |
| 2009/0067029 | A1 | 3/2009 | Yamada |
| 2018/0231853 | A1* | 8/2018 | Yamamoto .......... G02F 1/13338 |
| 2019/0305234 | A1* | 10/2019 | Jung ...................... H10K 59/87 |

FOREIGN PATENT DOCUMENTS

| KR | 10-2004-0104375 A | 12/2004 |
| KR | 10-2007-0035832 | 4/2007 |
| KR | 10-2012-0122533 A | 11/2012 |

OTHER PUBLICATIONS

Shukla V. (2019). Review of electromagnetic interference shielding materials fabricated by iron ingredients. Nanoscale advances, 1(5), 1640-1671. https://doi.org/10.1039/c9na00108e (Year: 2019).*

* cited by examiner

*Primary Examiner* — Julio J Maldonado
*Assistant Examiner* — Nathan Pridemore
(74) *Attorney, Agent, or Firm* — F. CHAU & ASSOCIATES, LLC

(57) ABSTRACT

A display device including: a substrate including a display area and a non-display area adjacent to the display area; a data driver disposed in the non-display area, and configured to provide a data voltage to the display area; a first power line disposed in the non-display area, adjacent to the data driver, and configured to transfer a first power voltage to the display area; and a cover film overlapping the data driver and the first power line, wherein the cover film includes a first layer including a first shielding portion overlapping the first power line.

12 Claims, 10 Drawing Sheets

COVER FILM AND A DISPLAY DEVICE INCLUDING THE SAME

This application claims priority under 35 U.S.C. § 119 to Korean Patent Application No. 10-2021-0019819, filed on Feb. 15, 2021, the disclosure of which is incorporated by reference herein in its entirety.

1. TECHNICAL FIELD

Embodiments of the present invention relate generally to a cover film and a display device including the cover film. More particularly, embodiments of the invention relate to a cover film that may shield noise due to electromagnetic interference.

2. DESCRIPTION OF THE RELATED ART

A display device is an output device for presentation of information in visual form. A display device is driven through various voltages and signals, and accordingly, electromagnetic interference noise ("EMI noise") may be generated. Various electronic devices (e.g., an antenna, global positioning system (GPS) circuitry, etc.) are included in an electronic device with the display device. Due to EMI noise generated in the display device, the display device and/or the electronic device may malfunction.

SUMMARY

Embodiments of the present invention provide a cover film that may shield (or absorb) electromagnetic interference noise.

Embodiments of the present invention provide a display device including the cover film.

An embodiment of the present invention provides a display device including: a substrate including a display area and a non-display area adjacent to the display area; a data driver disposed in the non-display area, and configured to provide a data voltage to the display area; a first power line disposed in the non-display area, adjacent to the data driver, and configured to transfer a first power voltage to the display area; and a cover film overlapping the data driver and the first power line, wherein the cover film includes a first layer including a first shielding portion overlapping the first power line.

The first layer may further include an insulating portion adjacent to the first shielding portion and overlapping the data driver.

The insulating portion may include polyimide.

The display device may further include: a second power line disposed in the non-display area, adjacent to the first power line, and configured to transfer a second power voltage to the display area, wherein the first shielding portion further overlaps the second power line.

The first power line may be disposed between the data driver and the second power line.

The display device may further include: a third power line disposed in the non-display area, adjacent to the data driver, and configured to transfer the first power voltage to the display area; and a fourth power line disposed in the non-display area, adjacent to the third power line, and configured to transfer the second power voltage to the display area, wherein the cover film further includes a second shielding portion overlapping the third power line and the fourth power line.

The third power line may be disposed between the data driver and the fourth power line.

The cover film may further include a second layer disposed on the first layer.

The second layer may include an insulating material.

The cover film may further include a conductive layer disposed on the first layer.

The cover film may further include an adhesive layer disposed between the data driver and the first layer.

The adhesive layer may include a conductive material.

The first shielding portion may include a conductive material and an elastic material.

The conductive material may a metal flake including iron, and the elastic material may be a polymer.

An embodiment of the present invention provides a display device including: a substrate including a display area and a non-display area adjacent to the display area; a data driver disposed in the non-display area, and configured to transfer a data voltage to the display area; a first power line disposed in the non-display area, adjacent to the data driver, and configured to transfer a first power voltage to the display area; and a cover film covering the data driver, wherein the cover film includes: an adhesive layer overlapping the first power line and including a conductive material; and a first layer disposed on the adhesive layer and including an insulating material.

The adhesive layer may be adhered to the data driver.

An embodiment of the present invention provides a cover film including: an adhesive layer; a first layer disposed on the adhesive layer and including an insulating portion and a shielding portion adjacent to the insulating portion; and a second layer disposed on the first layer.

The second layer may include a same insulating material as the insulating portion.

The second layer may include a conductive material.

The shielding portion may include a conductive material and an elastic material.

An embodiment of the present invention provides a display device including: a first power line disposed on a substrate; a second power line spaced apart from the first power line on the substrate; a data driver disposed between the first power line and the second power line; a first shielding layer adjacent to a first side of the data driver and overlapping the first power line; and a second shielding layer adjacent to a second side of the data driver and overlapping the second power line.

The display device may further include an insulating portion overlapping the data driver and contacting the first shielding layer and the second shielding layer.

The display device may further include an adhesive layer between the first power line and the first shielding layer and between the second power line and the second shielding layer.

The adhesive layer may overlap the data driver.

The display device may further include a conductive layer disposed on the first and second shielding layers.

DETAILED DESCRIPTION OF THE EMBODIMENTS

Figure 1:
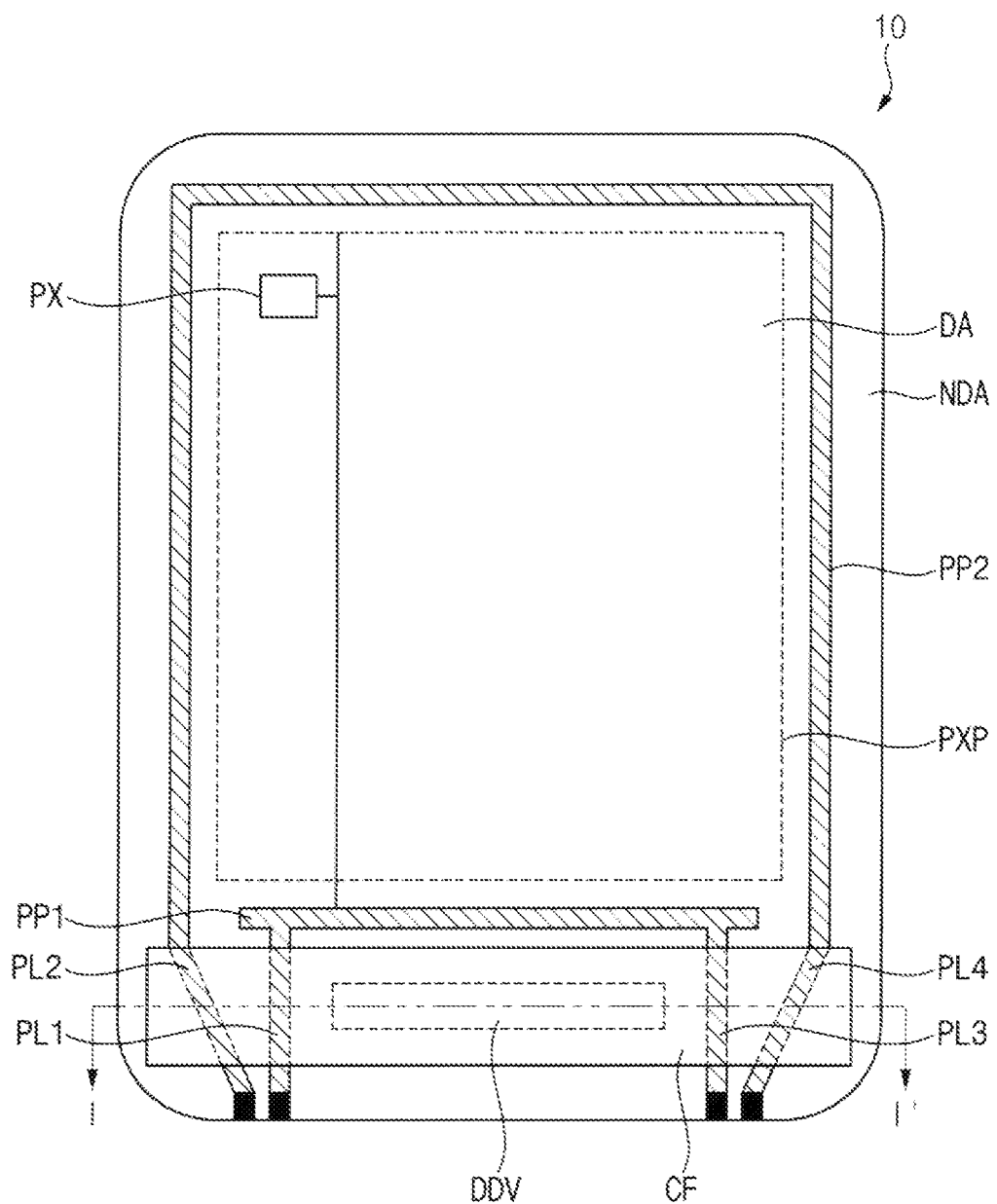
FIG. 1 is a plan view illustrating a display device according to embodiments of the present invention.

Illustrative, non-limiting embodiments of the present invention will be more clearly understood from the following detailed description in conjunction with the accompanying drawings.

It will be understood that when an element is referred to as being "on" another element, it can be directly on the other element or intervening elements may be therebetween. When an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. For example, these terms may only be used to distinguish one element, component, region, layer or section from another element, component, region, layer or section. Thus, "a first element," "component," "region," "layer" or "section" discussed below could be termed a second element, component, region, layer or section.

The terminology used herein is for the purpose of describing particular embodiments and is not intended to be limiting. As used herein, the singular forms "a," "an," and "the" are intended to include the plural forms, including "at least one," unless the content clearly indicates otherwise. "Or" may mean "and/or." As used herein, the term "and/or" may include any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. In an embodiment of the present invention, when the device in one of the figures is turned over, elements described as being on the "lower" side of other elements would then be oriented on "upper" sides of the other elements. The term "lower," can therefore, encompass both an orientation of "lower" and "upper," depending on the particular orientation of the figure. Similarly, when the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" can mean within one or more standard deviations, or within ±30%, 20%, 10%, 5% of the stated value.

Unless otherwise defined, all terms (including technical and scientific terms) used herein may have the same meaning as commonly understood by one of ordinary skill in the art to which this invention belongs. It will be further understood that terms, such as those defined in commonly used dictionaries, may be interpreted as having a meaning that is consistent with their meaning in the context of the relevant art and the invention.

Figure 2:
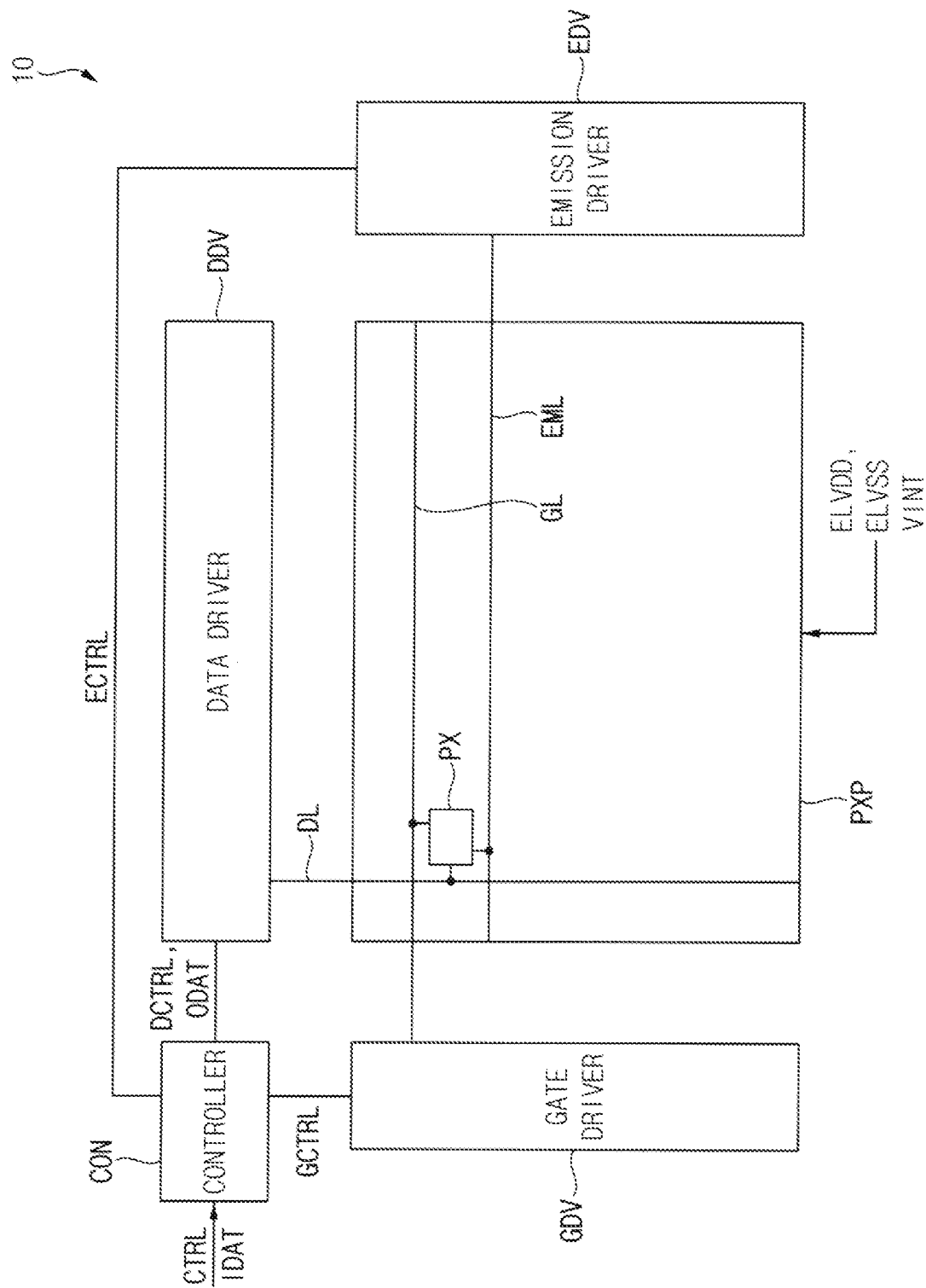
FIG. 2 is a block diagram illustrating the display device of FIG. 1.
Figure 3:
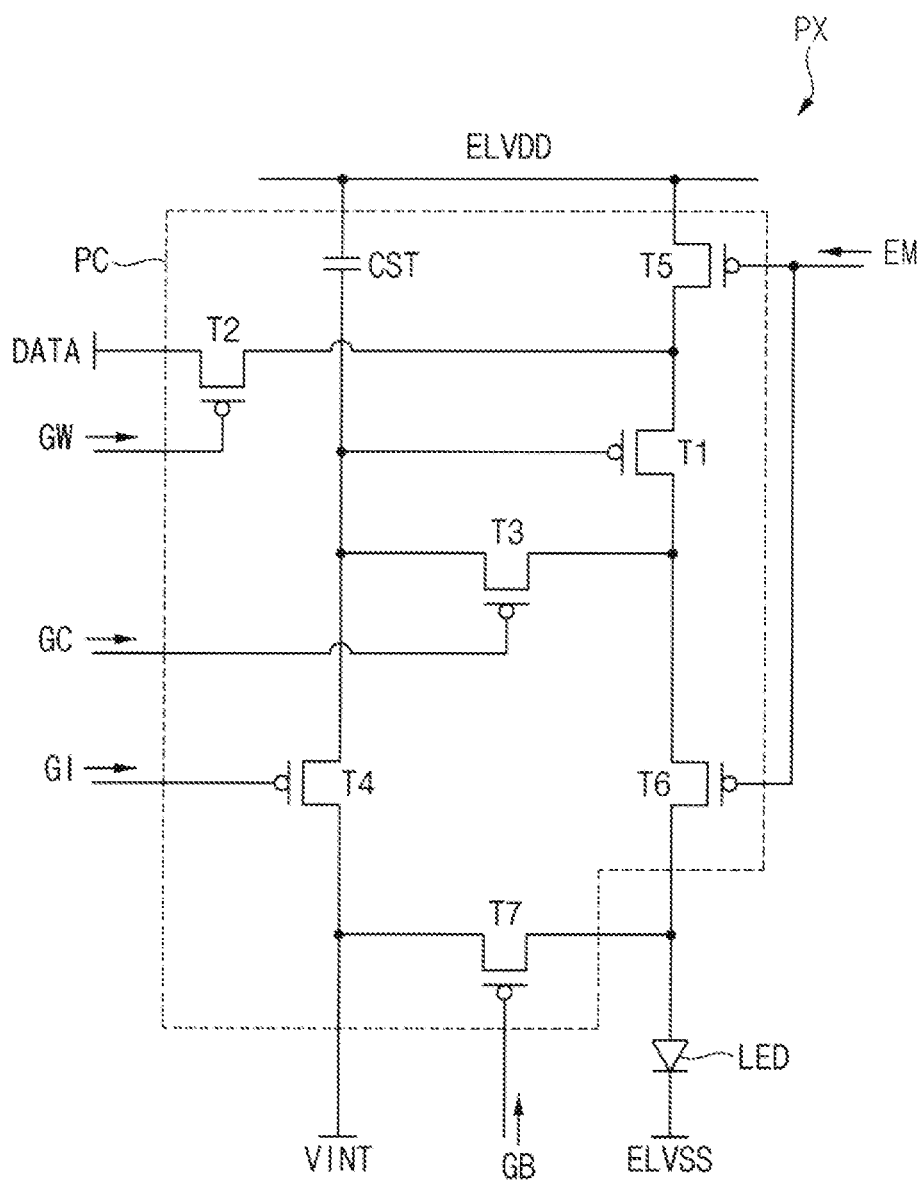
FIG. 3 is an equivalent circuit diagram illustrating a pixel included in the display device of FIG. 1.

FIG. 1 is a plan view illustrating a display device according to embodiments of the present invention. FIG. 2 is a block diagram illustrating the display device of FIG. 1. FIG. 3 is an equivalent circuit diagram illustrating a pixel included in the display device of FIG. 1.

Referring to FIG. 1, a display device 10 according to embodiments of the present invention may include a pixel part PXP, a data driver DDV, a first power line PL1, a second power line PL2, a third power line PL3, a fourth power line PL4, a cover film CF, a first power pattern PP1, and a second power pattern PP2. The cover film CF may overlap the data driver DDV and a portion of each of the first to fourth power lines PL1 to PL4. The cover film CF may have a rectangular shape but is not limited thereto.

The pixel part PXP may include at least one pixel PX, and may receive a voltage (e.g., a power voltage and/or a data voltage) for driving the pixel PX. In addition, a data line (e.g., a data line DL in FIG. 2) connected to the pixel PX, a gate line (e.g., a gate line GL in FIG. 2) connected to the pixel PX, and an emission control line (e.g., an emission control line EML in FIG. 2) connected to the pixel PX may be disposed in the pixel part PXP.

The data driver DDV may overlap a non-display area NDA in the display device 10. In an embodiment of the present invention, the non-display area NDA may be adjacent to a display area DA. For example, the display area DA may have a rectangular shape, and the non-display area NDA may surround the display area DA.

In an embodiment of the present invention, the data driver DDV may be disposed in the non-display area NDA and may be an integrated circuit. For example, the data driver DDV may be bonded to be connected to fan-out lines disposed in the non-display area NDA, and the data voltage (e.g., a data voltage DATA in FIG. 3) may be transferred to the display area DA through the fan-out lines. However, a structure in which the data driver DDV is disposed is not limited thereto. For example, the data driver DDV may be disposed on a separate printed circuit board.

The data driver DDV may generate the data voltage DATA and may provide the data voltage DATA to the display area DA. This will be described with reference to FIG. 2.

The first to fourth power lines PL1, PL2, PL3, and PL4 may overlap the non-display area NDA. In an embodiment of the present invention, the first power line PL1 may be adjacent to the data driver DDV and may be disposed on a left side of the data driver DDV. The second power line PL2 may be adjacent to the first power line PL1 and may be disposed on a left side of the first power line PL1. In other words, the first power line PL1 may be located between the second power line PL2 and the data driver DDV. The third power line PL3 may be adjacent to the data driver DDV and may be disposed on a right side of the data driver DDV. The fourth power line PL4 may be adjacent to the third power line PL3 and may be disposed on a right side of the third power line PL3. In other words, the third power line PL3 may be located between the fourth power line PL4 and the data driver DDV. Accordingly, the first and second power lines PL1 and PL2 may be symmetrical to the third and fourth power lines PL3 and PL4 with respect to the data driver DDV.

However, the number and arrangement of the first to fourth power lines PL1, PL2, PL3, and PL4 are not limited thereto. For example, the display device 10 may include the first and second power lines PL1 and PL2 and may not include the third and fourth power lines PL3 and PL4. In addition, all of the first to fourth power lines PL1, PL2, PL3, and PL4 may be disposed on the left (or right) side of the data driver DDV.

The first to fourth power lines PL1, PL2, PL3, and PL4 may transfer the power voltage from pads to the display area DA. For example, the pads may be connected to a flexible printed circuit board to which a power management integrated circuit ("PMIC") is attached, and may receive the power voltage from the PMIC. In an embodiment of the present invention, the first power line PL1 may transfer a first power voltage (e.g., a first power voltage ELVDD in FIG. 3), the second power line PL2 may transfer a second power voltage (e.g., a second power voltage ELVSS in FIG. 3), the third power line PL3 may transfer the first power voltage ELVDD, and the fourth power line PL4 may transfer the second power voltage ELVSS.

However, the power voltage transferred by the first to fourth power lines PL1, PL2, PL3, and PL4 is not limited thereto. For example, the first and third power lines PL1 and PL3 may transfer the second power voltage ELVSS, and the second and fourth power lines PL2 and PL4 may transfer the first power voltage ELVDD. In addition, the first to fourth power lines PL1, PL2, PL3, and PL4 may transfer a voltage different from the power voltage. For example, the first to fourth power lines PL1, PL2, PL3, and PL4 may transfer an initialization voltage (e.g., an initialization voltage VINT in FIG. 3).

The cover film CF may be disposed on the data driver DDV and may cover the data driver DDV. In addition, the cover film CF may overlap the first to fourth power lines PL1, PL2, PL3, and PL4.

The cover film CF may be disposed to completely cover an exposed portion of the data driver DDV. In other words, the cover film CF may overlap the entire data driver DDV. Accordingly, the cover film CF may protect the data driver DDV. For example, the cover film CF may prevent electrostatic discharge ("ESD") of the data driver DDV and may protect the data driver DDV from external impact. For example, the cover film CF may discharge an ESD such that the ESD does not impact the data driver DDV.

In addition, the cover film CF may overlap the first to fourth power lines PL1, PL2, PL3, and PL4. Accordingly, the cover film CF may shield (or absorb) an electromagnetic interference noise ("EMI noise") generated from the first to fourth power lines PL1, PL2, PL3, and PL4. In other words, the cover film CF may prevent the EMI noise generated by the first to fourth power lines PL1, PL2, PL3, and PL4 from impacting nearby components such as the data driver DDV.

The first power pattern PP1 may overlap the non-display area NDA and may be disposed between the display area DA and the data driver DDV. The first power pattern PP1 may be connected to the first and third power lines PL1 and PL3. For example, the first power pattern PP1 may form a bridge between the first and third power lines PL1 and PL3. The first power pattern PP1 may receive the first power voltage ELVDD from the first and third power lines PL1 and PL3, and may transfer the first power voltage ELVDD to the display area DA.

The second power pattern PP2 may overlap the non-display area NDA and may surround the display area DA. The second power pattern PP2 may be connected to the second and fourth power lines PL2 and PL4. For example, the second power pattern PP2 may form a bridge between the second and fourth power lines PL2 and PL4. The second power pattern PP2 may receive the second power voltage ELVSS from the second and fourth power lines PL2 and PL4, and may transfer the second power voltage ELVSS to the display area DA.

Referring to FIG. 2, the display device 10 may include a gate driver GDV, the data driver DDV, an emission driver EDV, and a controller CON for driving the pixel part PXP.

The gate driver GDV may generate gate signals GW, GC, GI, and GB based on a gate control signal GCTRL. For example, the gate signals GW, GC, GI, and GB may include a gate-on voltage for turning on a transistor and a gate-off voltage for turning off the transistor. The gate control signal GCTRL may include a vertical start signal, a clock signal, and the like.

The data driver DDV may generate the data voltage DATA based on an output image data ODAT and a data control signal DCTRL. For example, the data driver DDV may generate the data voltage DATA corresponding to the output image data ODAT and may output the data voltage DATA in response to the data control signal DCTRL. The data control signal DCTRL may include an output data enable signal, a horizontal start signal, and a load signal.

The emission driver EDV may generate an emission control signal EM based on an emission driving signal ECTRL. For example, the emission driving signal ECTRL may include a vertical start signal, a clock signal, etc., and the emission control signal EM may include a gate-on voltage for turning on the transistor and a gate-off voltage for turning off the transistor.

The controller CON (e.g., timing controller) may receive an input image data IDAT and a control signal CTRL from an external host processor (e.g., a graphics processing unit (GPU)). For example, the input image data IDAT may be RGB data including red image data, green image data, and blue image data. The control signal CTRL may include a vertical synchronization signal, a horizontal synchronization signal, an input data enable signal, a master clock signal, and the like. The controller CON may generate the gate control signal GCTRL, the emission driving signal ECTRL, the data control signal DCTRL, and the output image data ODAT based on the input image data IDAT and the control signal CTRL.

Referring to FIG. 3, the pixel PX may include a pixel circuit PC and a light emitting diode LED. The pixel circuit PC may provide a driving current to the light emitting diode LED, and the light emitting diode LED may generate light based on the driving current. For example, the light emitting diode LED may include an organic light emitting diode, an inorganic light emitting diode, a nano light emitting diode, or the like.

The pixel circuit PC may include a first transistor T1, a second transistor T2, a third transistor T3, a fourth transistor T4, a fifth transistor T5, a sixth transistor T6, a seventh transistor T7, and a storage capacitor CST.

The light emitting diode LED may include a first terminal (e.g., an anode terminal) and a second terminal (e.g., a cathode terminal). The first terminal of the light emitting diode LED may be connected to the sixth transistor T6 and the seventh transistor T7, and the second terminal of the light emitting diode LED may receive the second power voltage ELVSS. The light emitting diode LED may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive the first power voltage ELVDD. The storage capacitor CST may maintain a voltage level of a gate terminal of the first transistor T1 during an inactivation period of the first gate signal GW.

The first transistor T1 may include the gate terminal, a first terminal (e.g., a source terminal), and a second terminal (e.g., a drain terminal). The gate terminal of the first transistor T1 may be connected to the first terminal of the storage capacitor CST. For example, the first terminal of the storage capacitor CST may be directly connected to the gate terminal of the first transistor T1. The first terminal of the first transistor T1 may be connected to the second transistor T2 and may receive the data voltage DATA. For example, the first transistor T1 may receive the data voltage DATA when the second transistor T2 is turned on. The second terminal of the first transistor T1 may be connected to the sixth transistor T6. The first transistor T1 may generate the driving current based on a voltage difference between the gate terminal of the first transistor T1 and the first terminal of the first transistor T1. For example, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or off in response to the first gate signal GW. For example, when the second transistor T2 is a p-channel metal oxide semiconductor (PMOS) transistor, the second transistor T2 may be turned off when the first gate signal GW has a positive voltage level, and may be turned on when the first gate signal GW has a negative voltage level. The first terminal of the second transistor T2 may receive the data voltage DATA through the data line DL. The second terminal of the second transistor T2 may provide the data voltage DATA to the first terminal of the first transistor T1 while the second transistor T2 is turned on. For example, the second transistor T2 may be referred to as a switching transistor.

The third transistor T3 may include a gate terminal, a first terminal (e.g., a source terminal), and a second terminal (e.g., a drain terminal). The gate terminal of the third transistor 13 may receive a second gate signal GC. The second gate signal GC may be different than the first gate signal GW. The first terminal of the third transistor T3 may be connected to the second terminal of the first transistor T1. The second terminal of the third transistor T3 may be connected to the first terminal of the first transistor T1. The second terminal of the third transistor T3 may be connected to the first terminal of the storage capacitor CST.

The third transistor T3 may be turned on or off in response to the second gate signal GC. For example, when the third transistor T3 is a PMOS transistor, the third transistor T3 may be turned off when the second gate signal GC has a positive voltage level, and may be turned on when the second gate signal GC has a negative voltage level.

During a period in which the third transistor T3 is turned on in response to the second gate signal GC, the third transistor T3 may diode-connect the first transistor T1. Accordingly, the third transistor T3 may compensate for a threshold voltage of the first transistor T1. For example, the third transistor T3 may be referred to as a compensation transistor.

The fourth transistor T4 may include a gate terminal, a first terminal (e.g., a source terminal), and a second terminal (e.g., a drain terminal). The gate terminal of the fourth transistor T4 may receive a third gate signal GI. The third gate signal GI may be different than the second gate signal GC. The first terminal of the fourth transistor T4 may be connected to the gate terminal of the first transistor T1. The second terminal of the fourth transistor T4 may receive the initialization voltage VINT.

The fourth transistor T4 may be turned on or off in response to the third gate signal GI. For example, when the fourth transistor T4 is a PMOS transistor, the fourth transistor T4 may be turned off when the third gate signal GI has a positive voltage level, and may be turned on when the third gate signal GI has a negative voltage level.

During a period in which the fourth transistor T4 is turned on by the third gate signal GI, the initialization voltage VINT may be provided to the gate terminal of the first transistor T1. Accordingly, the fourth transistor T4 may initialize the gate terminal of the first transistor T1 to the initialization voltage VINT. For example, the fourth transistor T4 may be referred to as a gate initialization transistor.

The fifth transistor T5 may include a gate terminal, a first terminal (e.g., a source terminal), and a second terminal (e.g., a drain terminal). The gate terminal of the fifth transistor T5 may receive the emission control signal EM. The first terminal of the fifth transistor T5 may receive the first power supply voltage ELVDD. The second terminal of the fifth transistor T5 may be connected to the first transistor T1. The second terminal of the fifth transistor T5 may also be connected to the second transistor T2. When the fifth transistor T5 is turned on in response to the emission control signal EM, the fifth transistor T5 may provide the first power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the first transistor T1. The second terminal of the sixth transistor T6 may be connected to the light emitting diode LED. For example, the second terminal of the sixth transistor T6 may be connected to the anode of the light emitting diode LED. When the sixth transistor T6 is turned on in response to the emission control signal EM, the sixth transistor T6 may provide the driving current to the light emitting diode LED.

The seventh transistor T7 may include a gate terminal, a first terminal (e.g., a source terminal), and a second terminal (e.g., a drain terminal). The gate terminal of the seventh transistor T7 may receive a fourth gate signal GB. The fourth gate signal GB may be different than the third gate signal GI.

The first terminal of the seventh transistor T7 may be connected to the light emitting diode LED. The second terminal of the seventh transistor T7 may receive the initialization voltage VINT.

When the seventh transistor T7 is turned on in response to the fourth gate signal GB, the seventh transistor T7 may provide the initialization voltage VINT to the light emitting diode LED. Accordingly, the seventh transistor T7 may initialize the first terminal of the light emitting diode LED to the initialization voltage VINT. For example, the seventh transistor T7 may be referred to as an anode initialization transistor.

The circuit structure of the pixel circuit PC illustrated in FIG. 3 is exemplary and may be variously changed.

Figure 4:
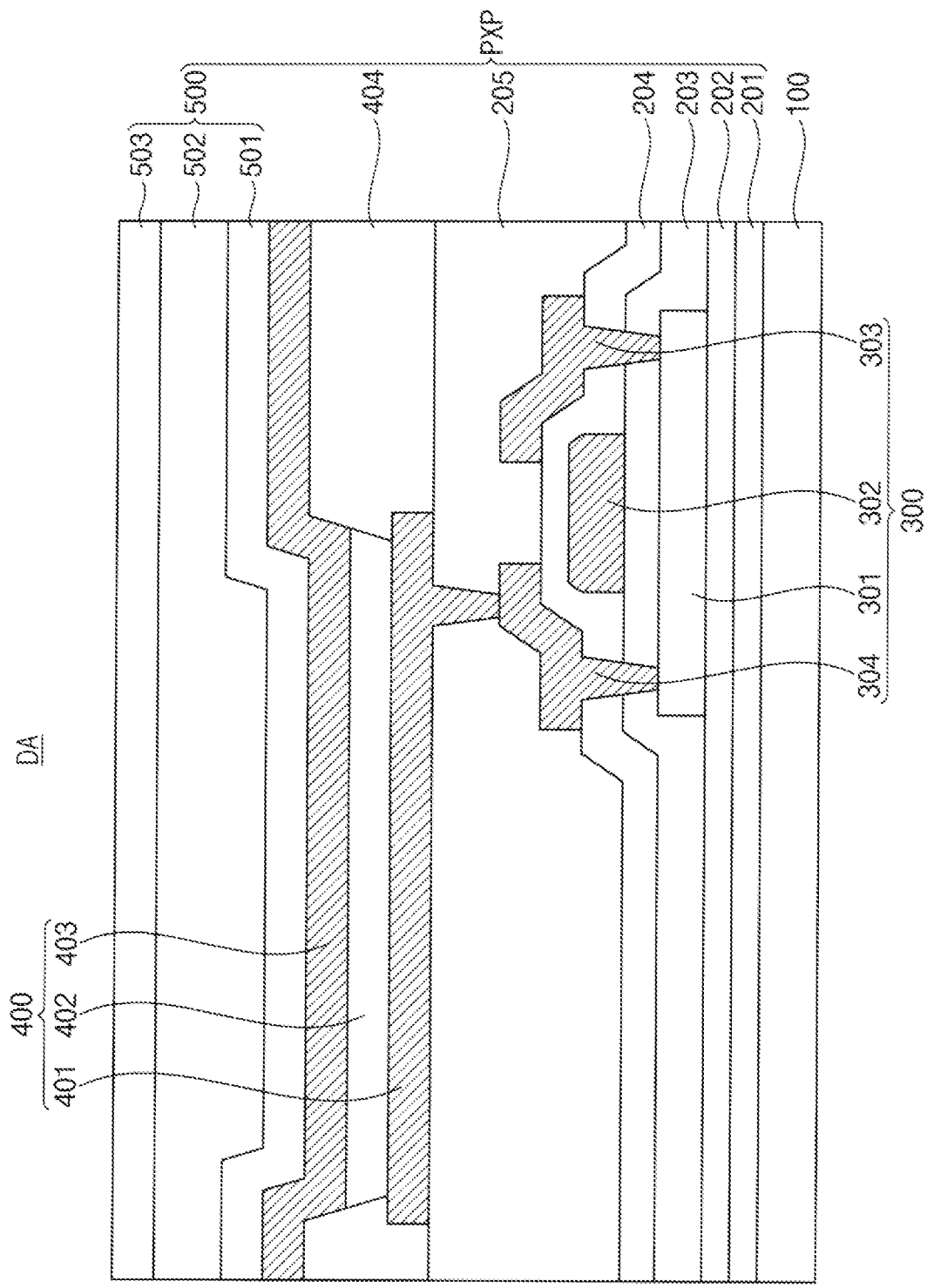
FIG. 4 is a cross-sectional view illustrating a display panel included in the display device of FIG. 1.

FIG. 4 is a cross-sectional view illustrating a display panel included in the display device of FIG. 1.

Referring to FIG. 4, the pixel part PXP may be disposed on a substrate 100. The pixel part PXP may include a barrier layer 201, a buffer layer 202, an active pattern 301, a gate insulating layer 203, a gate electrode 302, an interlayer insulating layer 204, a source electrode 303, a drain electrode 304, a via insulating layer 205, a first electrode 401, a pixel defining layer 404, an emission layer 402, a second electrode 403, a first inorganic layer 501, an organic layer 502, and a second inorganic layer 503. For example, the active pattern 301, the gate electrode 302, the source electrode 303, and the drain electrode 304 may constitute a transistor 300, and the transistor 300 may correspond to the sixth transistor T6 (or the seventh transistor T7) described with reference to FIG. 3. The first electrode 401, the emission layer 402, and the second electrode 403 may constitute an emission structure 400, and the emission structure 400 may correspond to the light emitting diode LED described with reference to FIG. 3. The first inorganic layer 501, the organic layer 502, and the second inorganic layer 503 may constitute a thin film encapsulation layer 500.

The substrate 100 may include glass, quartz, plastic, or the like. In an embodiment of the present invention, the substrate 100 may include plastic, and the display device 10 may have a flexible characteristic. In this case, the substrate 100 may have a structure in which at least one organic film layer and at least one barrier layer are alternately stacked. For example, the organic film layer may be formed using an organic material such as polyimide, and the barrier layer may be formed using an inorganic material. In another embodiment of the present invention, the substrate 100 may include glass, and the display device 10 may have a rigid characteristic.

The barrier layer 201 may be disposed on the substrate 100. In an embodiment of the present invention, the barrier layer 201 may include an inorganic material. For example, the barrier layer 201 may include silicon oxide, silicon nitride, silicon oxynitride, or the like.

The buffer layer 202 may be disposed on the substrate 100. The buffer layer 202 may prevent metal atoms or impurities from diffusing from the substrate 100 into the active pattern 301. In addition, the buffer layer 202 may control a heat providing rate during a crystallization process when forming the active pattern 301.

The active pattern 301 may be disposed on the buffer layer 202. In an embodiment of the present invention, the active pattern 301 may include a silicon semiconductor. For example, the silicon semiconductor may include amorphous silicon, polycrystalline silicon, or the like. In another embodiment of the present invention, the active pattern 301 may include an oxide semiconductor.

The gate insulating layer 203 may cover the active pattern 301 and may be disposed on the buffer layer 202. The gate insulating layer 203 may include an inorganic insulating material. For example, the gate insulating layer 203 may include silicon oxide, silicon nitride, silicon oxynitride, or the like.

The gate electrode 302 may be disposed on the gate insulating layer 203. The gate electrode 302 may include a metal, an alloy, a conductive metal oxide, a transparent conductive material, or the like. For example, the gate electrode 302 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The interlayer insulating layer 204 may cover the gate electrode 302 and may be disposed on the gate insulating layer 203. The interlayer insulating layer 204 may include an inorganic insulating material.

The source electrode 303 and the drain electrode 304 may be disposed on the interlayer insulating layer 204. In an embodiment of the present invention, the source electrode 303 and the drain electrode 304 may contact the active pattern 301. For example, the source electrode 303 and the drain electrode 304 may contact the active pattern 301 through holes in the interlayer insulating layer 204 and the gate insulating layer 203. The source electrode 303 may transfer the driving current (or the initialization voltage VINT) to the active pattern 301, and the drain electrode 304 may transfer the driving current (or the initialization voltage VINT) to the first electrode 401. The source electrode 303 and the drain electrode 304 may include a metal, an alloy, a conductive metal oxide, a transparent conductive material, or the like.

The via insulating layer 205 may cover the source electrode 303 and the drain electrode 304, and may be disposed on the interlayer insulating layer 204. The via insulating layer 205 may include an organic insulating material. For example, the via insulating layer 205 may include a photoresist, a polyacrylic resin, a polyimide resin, an acrylic resin, or the like. Accordingly, the via insulating layer 205 may have a substantially flat top surface.

The first electrode 401 may be disposed on the via insulating layer 205. In an embodiment of the present invention, the first electrode 401 may contact the drain electrode 304. For example, the first electrode 401 may contact the drain electrode 304 through a hole in the via insulating layer 205. The first electrode 401 may receive the driving current (or the initialization voltage VINT) from the drain electrode 304. The first electrode 401 may include a reflective metal material or a transparent metal material. For example, the first electrode 401 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide (IZO), and the like. In addition, the first electrode 401 may have a multilayer structure including Ag/ITO/Ag.

The pixel defining layer 404 may cover an end of the first electrode 401 and may be disposed on the via insulating layer 205. The pixel defining layer 404 may include an organic material. An opening exposing the first electrode 401 may be formed in the pixel defining layer 404.

The emission layer 402 may be disposed on the first electrode 401. For example, the emission layer 402 may be disposed in the opening. The emission layer 402 may generate light based on the driving current. In addition, to increase the luminous efficiency of the emission layer 402, the emission layer 402 may include a functional layer (e.g., a hole injection layer, a hole transport layer, an electron transport layer, an electron injection layer, etc.).

The second electrode 403 may be disposed on the emission layer 402. The second electrode 403 may have a plate shape and may receive the second power voltage ELVSS.

The first inorganic layer 501 may be disposed on the second electrode 403. For example, the first inorganic layer 501 may include an inorganic material. The organic layer 502 may be disposed on the first inorganic layer 501. For example, the organic layer 502 may include an organic material. Accordingly, the organic layer 502 may have a substantially flat top surface. The second inorganic layer 503 may be disposed on the organic layer 502. For example, the second inorganic layer 503 may include an inorganic material. The first inorganic layer 501, the organic layer 502, and the second inorganic layer 503 may constitute the thin film encapsulation layer 500. The thin film encapsulation layer 500 may protect the emission structure 400 from external impact and/or impurities.

Figure 5:
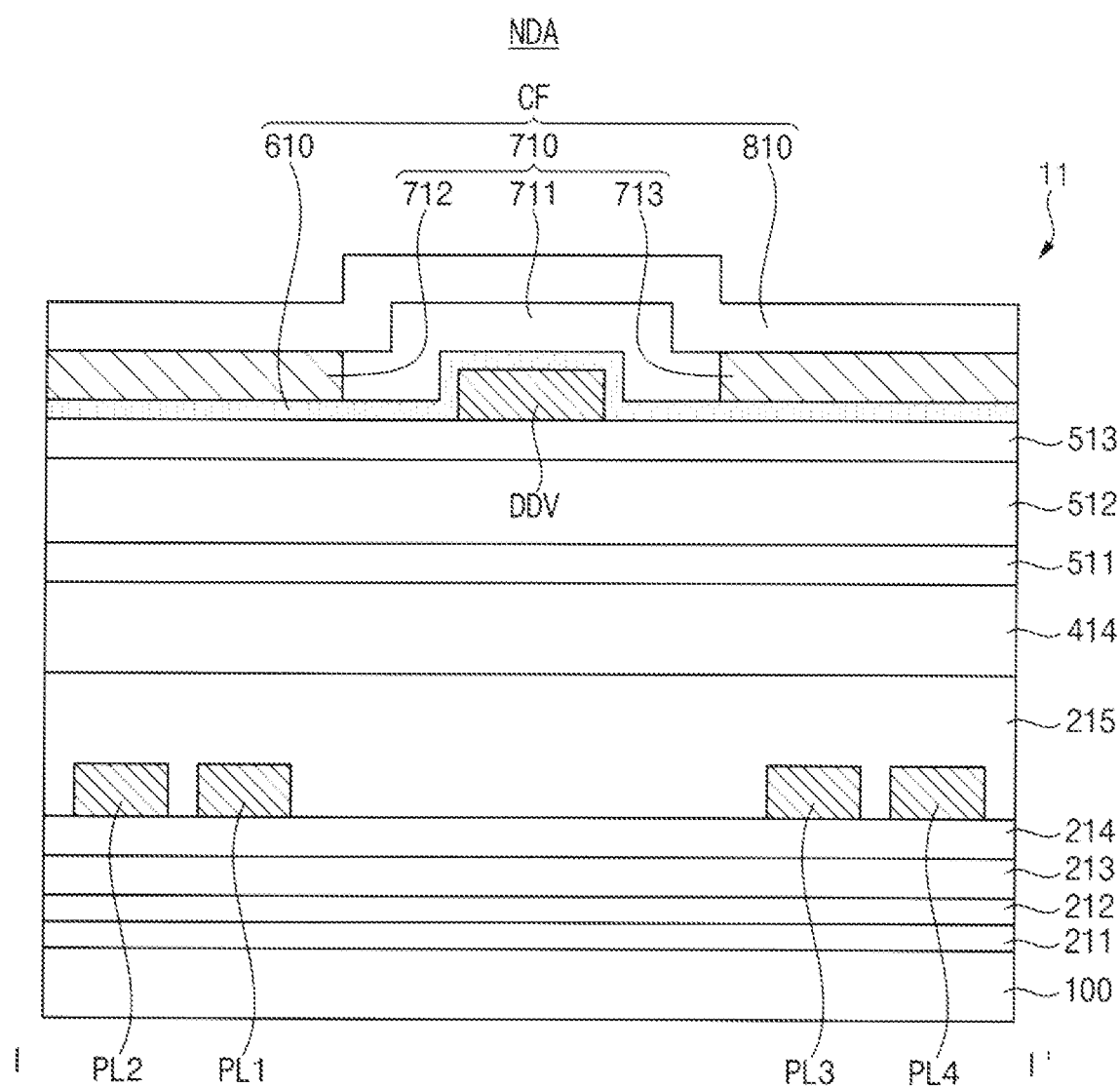
FIG. 5 is a cross-sectional view illustrating a display device according to an embodiment of the present invention.
Figure 6:
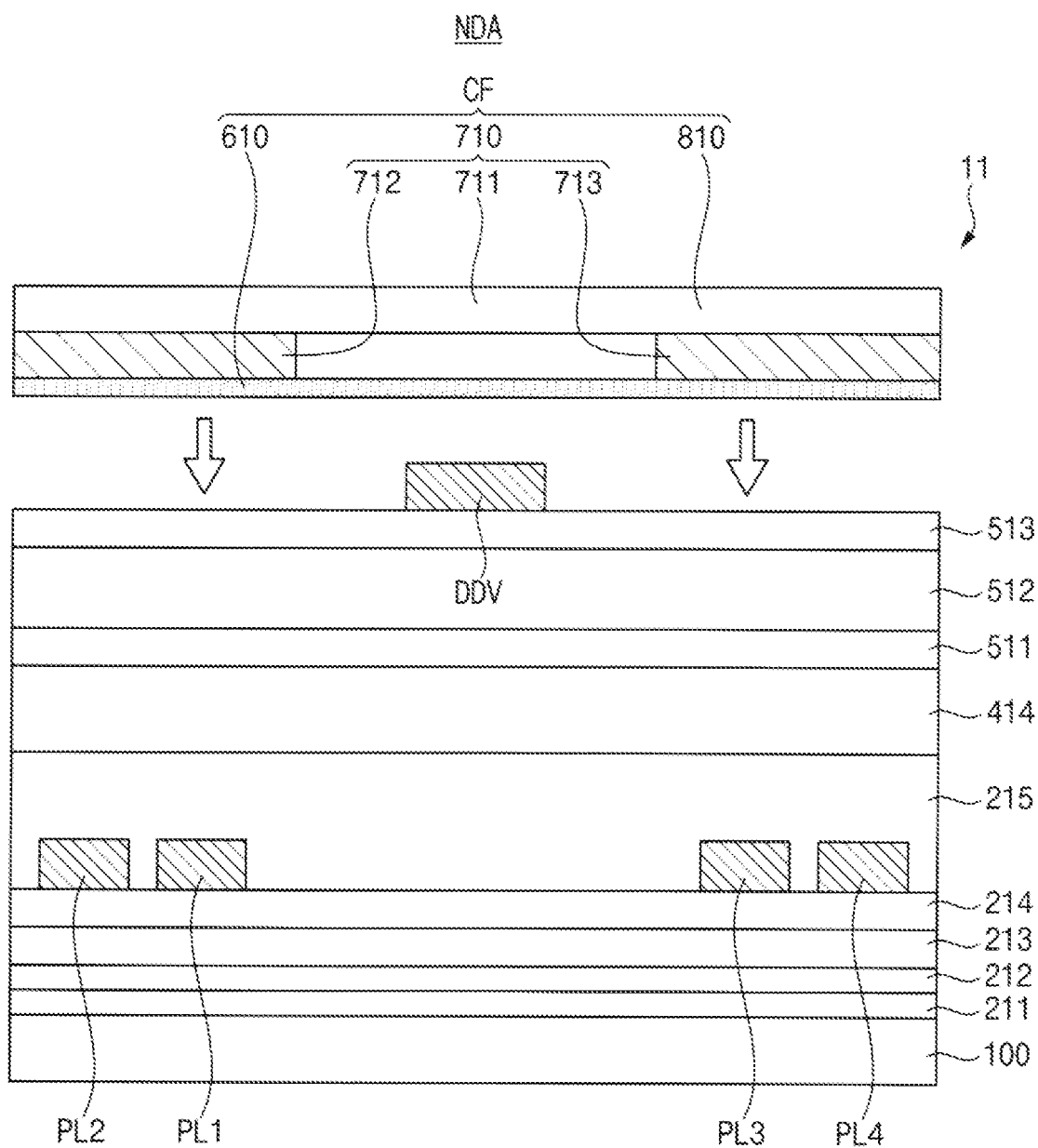
FIG. 6 is a cross-sectional view illustrating a method of manufacturing the display device of FIG. 5.

FIG. 5 is a cross-sectional view illustrating a display device according to an embodiment of the present invention. FIG. 6 is a cross-sectional view illustrating a method of manufacturing the display device of FIG. 5. For example, FIG. 5 is a cross-sectional view illustrating an example taken along line I-I' of FIG. 1.

Referring to FIGS. 1, 4, and 5, a display device 11 according to an embodiment of the present invention may include the substrate 100, a first insulating layer 211, a second insulating layer 212, a third insulating layer 213, a fourth insulating layer 214, the first power line PL1, the second power line PL2, the third power line PL3, the fourth power line PL4, a fifth insulating layer 215, a sixth insulating layer 511, a seventh insulating layer 512, an eighth insulating layer 513, the data driver DDV, and the cover film CF.

In an embodiment of the present invention, the cover film CF may include an adhesive layer 610, a first layer 710, and a second layer 810. The first layer 710 may include an insulating portion 711, a first shielding portion 712, and a second shielding portion 713.

The first insulating layer 211 may be disposed on the substrate 100. For example, the first insulating layer 211 may be formed together with the barrier layer 201.

The second insulating layer 212 may be disposed on the first insulating layer 211. For example, the second insulating layer 212 may be formed together with the buffer layer 202.

The third insulating layer 213 may be disposed on the second insulating layer 212. For example, the third insulating layer 213 may be formed together with the gate insulating layer 203.

The fourth insulating layer 214 may be disposed on the third insulating layer 213. For example, the fourth insulating layer 214 may be formed together with the interlayer insulating layer 204.

The first to fourth power lines PL1, PL2, PL3, and PL4 may be disposed on the fourth insulating layer 214. The first to fourth power lines PL1, PL2, PL3, and PL4 may be overlapped by the fifth insulating layer 215 and the fifth insulating layer 215 may fill gaps between adjacent power lines. For example, the fifth insulating layer 215 may be provided between the first and second power lines PL1 and PL2 and between the third and fourth power lines PL3 and PL4. In an embodiment of the present invention, the first to fourth power lines PL1, PL2, PL3, and PL4 may be formed together with the source electrode 303 (or the drain electrode 304). The first to fourth power lines P1, PL2, PL3, and PIA may include a metal, an alloy, a conductive metal oxide, a transparent conductive material, or the like. For example, the first to fourth power lines PL1, PL2, PL3, and PL4 may include silver ("Ag"), an alloy containing silver, molybdenum ("Mo"), an alloy containing molybdenum, aluminum ("Al"), alloys containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The fifth insulating layer 215 may cover the first to fourth power lines PL1, PL2, PL3, and PL4 and may be disposed on the fourth insulating layer 214. For example, the fifth insulating layer 215 may be formed together with the via insulating layer 205.

The sixth insulating layer 511 may be disposed on the fifth insulating layer 215. For example, the sixth insulating layer 511 may be formed together with the first inorganic layer 501. A pixel defining layer 414 may be provided between the sixth insulating layer 511 and the fifth insulating layer 215.

The seventh insulating layer 512 may be disposed on the sixth insulating layer 511. For example, the seventh insulating layer 512 may be formed together with the organic layer 502.

The eighth insulating layer 513 may be disposed on the seventh insulating layer 512. For example, the eighth insulating layer 513 may be formed together with the second inorganic layer 503.

The data driver DDV may be disposed on the eighth insulating layer 513. The data driver DDV may be in direct contact with the eighth insulating layer 513. The cover film CF may be disposed on the data driver DDV and may cover the data driver DDV. For example, the cover film CF may be disposed on top, left and right sides of the data driver DDV as shown in FIG. 5. Accordingly, the cover film CF may physically and/or electrically protect the data driver DDV.

The adhesive layer 610 may be disposed on the data driver DDV and may be adhered to the data driver DDV. The adhesive layer 610 may adhere the cover film CF to the data driver DDV. The adhesive layer 610 may secure the data driver DDV to the eighth insulating layer 513 and adhere the cover film CF to the eighth insulating layer 513. In an embodiment of the present invention, the adhesive layer 610 may include an adhesive material. For example, the adhesive layer 610 may include an optical clear adhesive ("OCA"), an optical clear resin ("OCR"), a pressure sensitive adhesive ("PSA"), or the like.

The first layer 710 may include the insulating portion 711, the first shielding portion 712, and the second shielding portion 713. In an embodiment of the present invention, the first shielding portion 712 may be adjacent to the insulating portion 711 on the left side of the insulating portion 711, and the second shielding portion 713 may be adjacent to the insulating portion 711 on the right side of the insulating portion 711. In other words, the insulating portion 711 may be disposed between the first shielding portion 712 and the second shielding portion 713.

The insulating portion 711 may overlap the data driver DDV. For example, the insulating portion 711 may extend along the top of the data driver DDV to opposite sides of the data driver DDV. The insulating portion 711 may not overlap the first to fourth power lines PL1 to PL4. In an embodiment of the present invention, the insulating portion 711 may include an insulating material. For example, the insulating portion 711 may include polyimide ("PI"). However, the insulating material included in the insulating portion 711 is not limited thereto.

The first shielding portion 712 may overlap the first and second power lines PL1 and PL2. The first shielding portion 712 may shield (or absorb) EMI noise generated from the first and second power lines PL1 and PL2. In an embodiment of the present invention, the first shielding portion 712 may include a conductive material having magnetism and an elastic material having elasticity. For example, the first shielding portion 712 may include a metal flake including iron ("Fe") and a polymer. However, the material included in the first shielding portion 712 is not limited thereto. For example, the first shielding portion 712 may include a material capable of shielding (or absorbing) EMI noise.

The second shielding portion 713 may overlap the third and fourth power lines PL3 and PL4. The second shielding portion 713 may shield (or absorb) EMI noise generated from the third and fourth power lines PL3 and PL4. In an embodiment of the present invention, the second shielding portion 713 may include a conductive material and an elastic material. For example, the second shielding portion 713 may include the same material as the first shielding portion 712.

The second layer 810 may be disposed on the first layer 710. In an embodiment of the present invention, the second layer 810 may include an insulating material. For example, the second layer 810 may include the same material (e.g., polyimide ("PI")) as the insulating portion 711. The second layer 810 may prevent the cover film CF from dielectric breakdown. However, the insulating material included in the second layer 810 is not limited thereto.

Referring to FIGS. 5 and 6, in a method of manufacturing the display device 11 illustrated in FIG. 5, the cover film CF may be adhered on the eighth insulating layer 513 to which the data driver DDV is adhered. The cover film CF may have a structure in which the adhesive layer 610, the first layer 710, and the second layer 810 are integrally formed. For example, the cover film CF may be adhered on the data driver DDV to cover the data driver DDV after a release paper adhered to a lower surface of the adhesive layer 610 is removed. In other words, the cover film CF is placed on the data driver DDV and the eighth insulating layer 513 after removal of the release paper.

According to an embodiment of the present invention, the display device 11 may include: a substrate 100 including a display area DA and a non-display area NDA adjacent to the display area DA; a data driver DDV disposed in the non-display area NDA, and configured to provide a data voltage DATA to the display area DA; a first power line PL1 disposed in the non-display area NDA, adjacent to the data driver DDV, and configured to transfer a first power voltage ELVDD to the display area DA; and a cover film CF overlapping the data driver DDV and the first power line PL1, wherein the cover film CF includes a first layer 710 including a first shielding portion 712 overlapping the first power line PL1.

Figure 7:
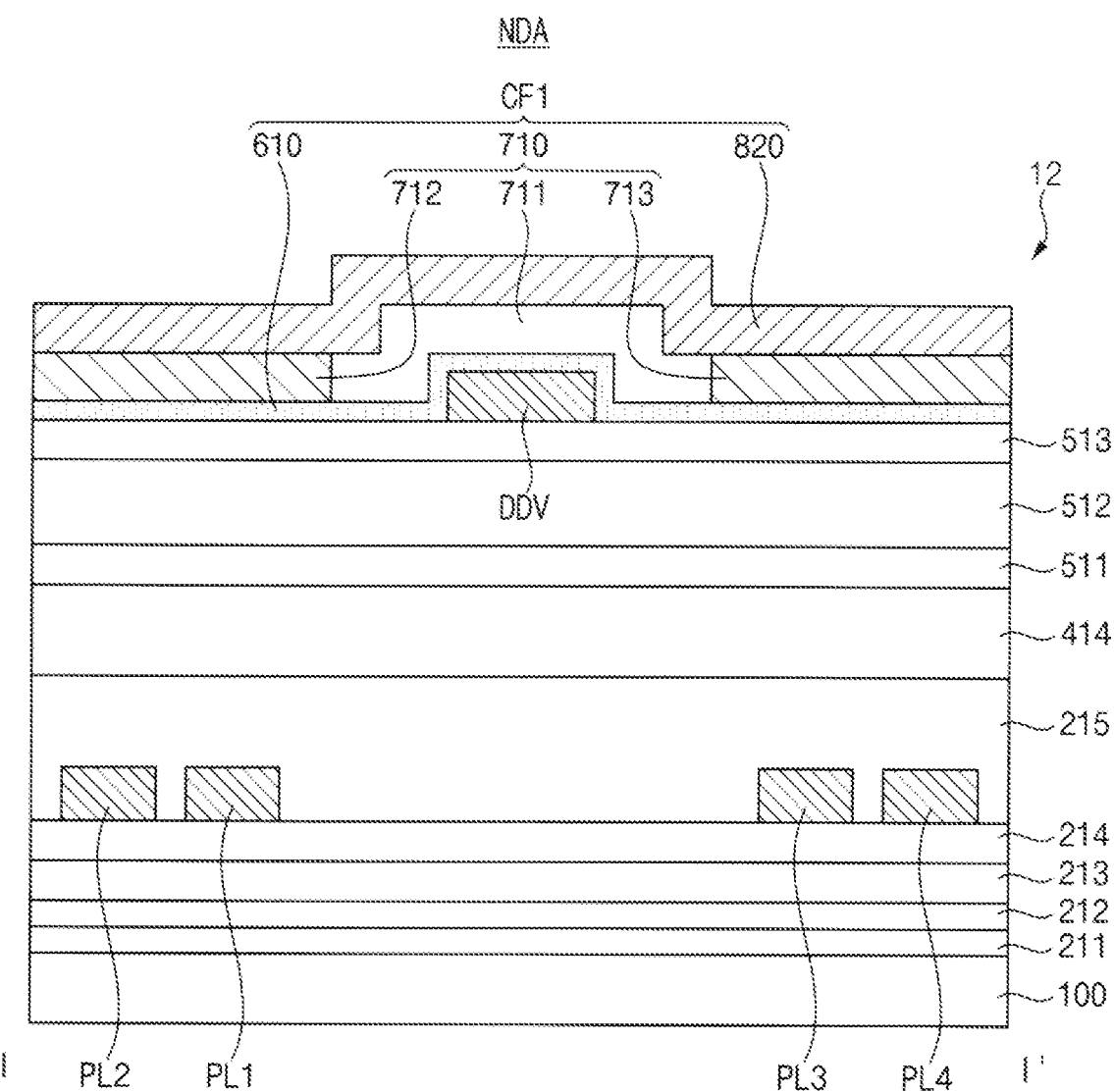
FIG. 7 is a cross-sectional view illustrating a display device according to another embodiment of the present invention.

FIG. 7 is a cross-sectional view illustrating a display device according to another embodiment of the present invention. For example, FIG. 7 is a cross-sectional view illustrating another example taken along line I-I' of FIG. 1.

Referring to FIGS. 1, 4, and 7, a display device 12 according to another embodiment of the present invention may include the substrate 100, the first insulating layer 211, the second insulating layer 212, the third insulating layer 213, the fourth insulating layer 214, the first power line PL1, the second power line PL2, the third power line PL3, the fourth power line PL4, the fifth insulating layer 215, the sixth insulating layer 511, the seventh insulating layer 512, the eighth insulating layer 513, the data driver DDV, and a cover film CF1. The display device 12 may further include the pixel defining layer 414.

In an embodiment of the present invention, the cover film CF1 may include the adhesive layer 610, the first layer 710, and a conductive layer 820. The first layer 710 may include the insulating portion 711, the first shielding portion 712, and the second shielding portion 713. The display device 12 may be substantially the same as the display device 11 described with reference to FIG. 5 except for the conductive layer 820. Hereinafter, the conductive layer 820 will be described.

The conductive layer 820 may be disposed on the first layer 710. In an embodiment of the present invention, the conductive layer 820 may include a conductive material. For example, the conductive layer 820 may be formed by conductively treating an upper surface of the first layer 810 with a metal (e.g., copper ("Cu")). As the conductive layer 820 is formed, static electricity generated during the manufacturing process of the display device 12 may be bypassed through the conductive layer 820.

Figure 8:
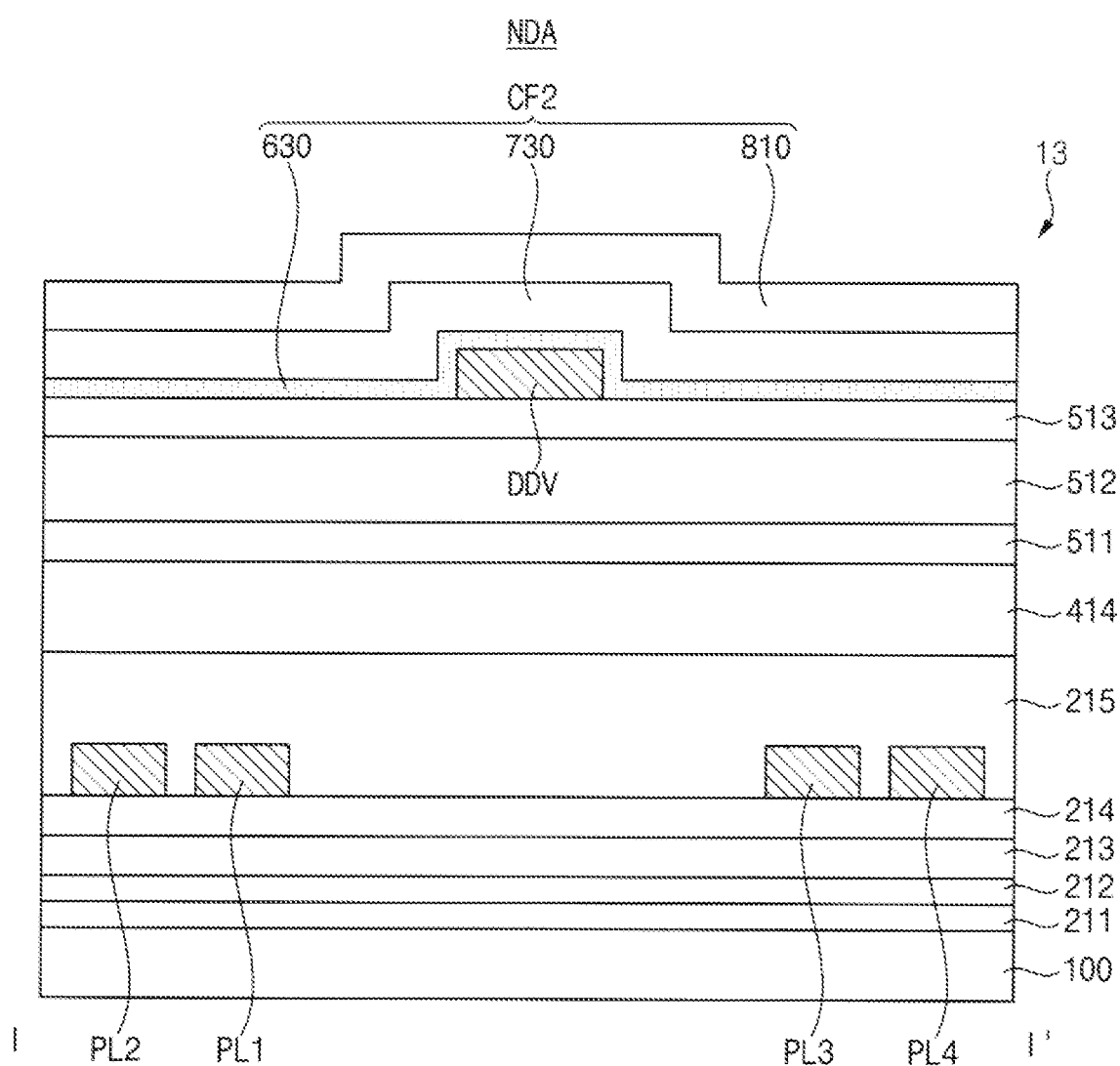
FIG. 8 is a cross-sectional view illustrating a display device according to still another embodiment of the present invention.

FIG. 8 is a cross-sectional view illustrating a display device according to still another embodiment of the present invention. For example, FIG. 8 is a cross-sectional view illustrating still another example taken along line I-I' of FIG. 1.

Referring to FIGS. 1, 4, and 8, a display device 13 according to still another embodiment of the present invention may include the substrate 100, the first insulating layer 211, the second insulating layer 212, the third insulating layer 213, the fourth insulating layer 214, the first power line PL1, the second power line PL2, the third power line PL3, the fourth power line PL4, the fifth insulating layer 215, the sixth insulating layer 511, the seventh insulating layer 512, the eighth insulating layer 513, the data driver DDV, and a cover film CF2. The display device 13 may further include the pixel defining layer 414.

In an embodiment of the present invention, the cover film CF2 may include an adhesive layer 630, a first layer 730, and the second layer 810. The display device 13 may be substantially the same as the display device 11 described with reference to FIG. 5, except for the adhesive layer 630 and the first layer 730. Hereinafter, the adhesive layer 630 and the first layer 730 will be described.

The adhesive layer 630 may be disposed on the data driver DDV and may be adhered to the data driver DDV. In other words, the adhesive layer 630 may disposed on top of the data driver DDV. In this case, the adhesive layer 630 may be disposed between the data driver DDV and the first layer 730. In an embodiment of the present invention, the adhesive layer 630 may include an adhesive material and a conductive material. For example, the adhesive layer 630 may include an optical clear adhesive ("OCA"), an optical clear resin ("OCR"), a pressure sensitive adhesive ("PSA"), or the like. In addition, the adhesive layer 630 may include a metal flake including iron ("Fe"). In other words, the adhesive layer 630 may be an adhesive layer in which an electromagnetic wave blocking material (or an electromagnetic wave absorbing material) is embedded.

The first layer 730 may be disposed on the adhesive layer 630. The first layer 730 may include an insulating material.

For example, the first layer 730 may include polyimide ("PI"). However, the insulating material included in the first layer 730 is not limited thereto.

Figure 9:
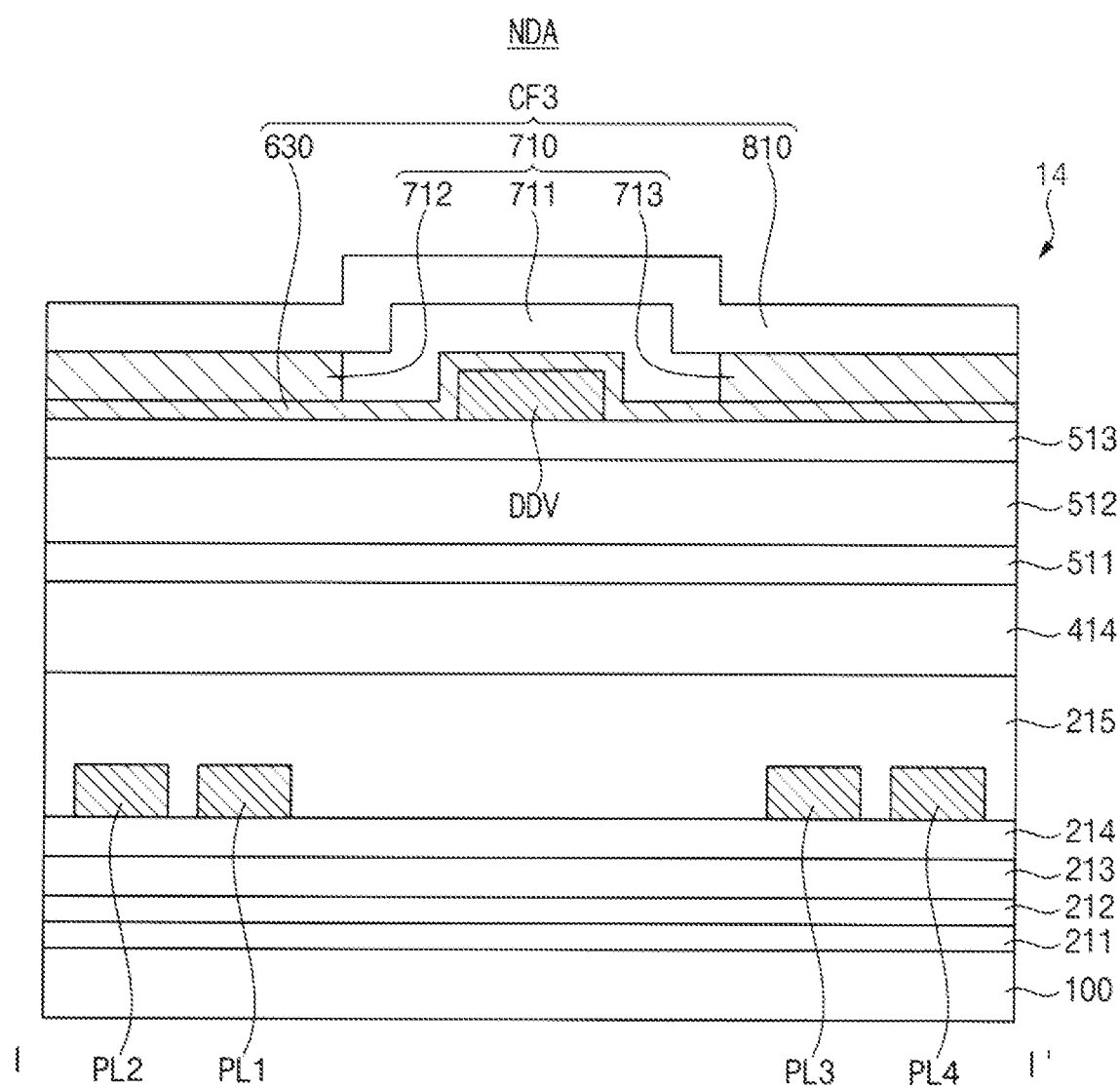
FIG. 9 is a cross-sectional view illustrating a display device according to still another embodiment of the present invention.

FIG. 9 is a cross-sectional view illustrating a display device according to still another embodiment of the present invention. For example, FIG. 9 is a cross-sectional view illustrating still another example taken along line I-I' of FIG. 1.

Referring to FIGS. 1, 4, and 9, a display device 14 according to still another embodiment of the present invention may include the substrate 100, the first insulating layer 211, the second insulating layer 212, the third insulating layer 213, the fourth insulating layer 214, the first power line PL1, the second power line PL2, the third power line PL3, the fourth power line PL4, the fifth insulating layer 215, the sixth insulating layer 511, the seventh insulating layer 512, the eighth insulating layer 513, the data driver DDV, and a cover film CF3. The display device 14 may further include the pixel defining layer 414.

In an embodiment of the present invention, the cover film CF3 may include the adhesive layer 630, the first layer 710, and the second layer 810.

The first layer 710 may include the insulating portion 711, the first shielding portion 712, and the second shielding portion 713. The adhesive layer 630 may be substantially the same as the adhesive layer 630 described with reference to FIG. 8, and the first layer 710 and the second layer 810 may be substantially the same as the first layer 710 and the second layer 810 described with reference to FIG. 5, respectively.

Figure 10:
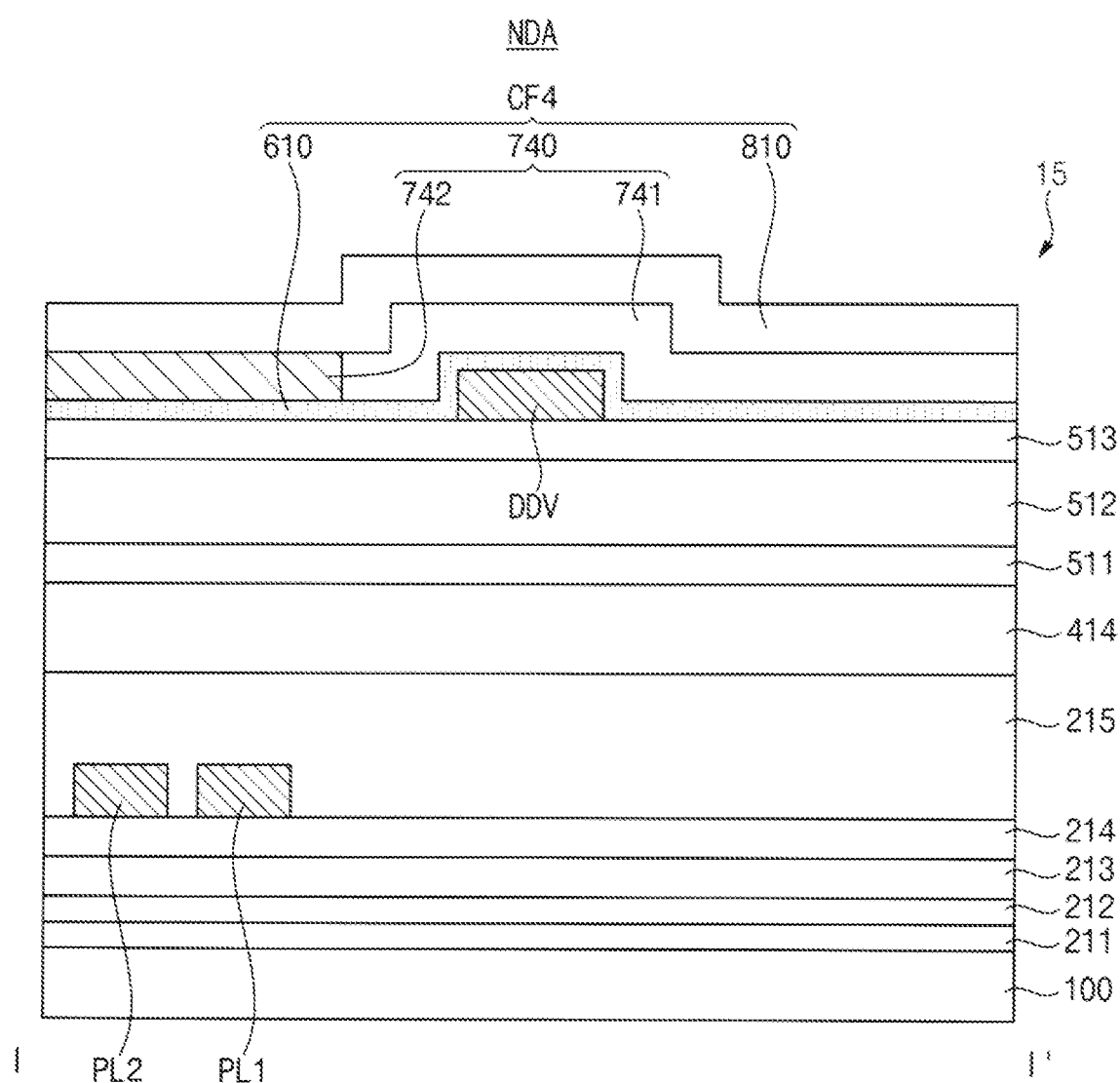
FIG. 10 is a cross-sectional view illustrating a display device according to still another embodiment of the present invention.

FIG. 10 is a cross-sectional view illustrating a display device according to still another embodiment of the present invention. For example, FIG. 10 is a cross-sectional view illustrating still another example taken along line I-I' of FIG. 1.

Referring to FIGS. 1, 4, and 10, a display device 15 according to another embodiment of the present disclosure includes the substrate 100, the first insulating layer 211, the second insulating layer 212, the third insulating layer 213, the fourth insulating layer 214, the first power line PL1, the second power line PL2, the fifth insulating layer 215, the sixth insulating layer 511, the seventh insulating layer 512, the eighth insulating layer 513, the data driver DDV, and a cover film CF4. The display device 15 may further include the pixel defining layer 414.

In an embodiment of the present invention, the cover film CF4 may include the adhesive layer 610, a first layer 740, and the second layer 810. The display device 15 may be substantially the same as the display device 11 described with reference to FIG. 5 except for the third power line PL3, the fourth power line PL4, and the first layer 740.

The display device 15 may include the first and second power lines PL1 and PL2 and may not include the third and fourth power lines PL3 and PL4. In other words, as described above, the number of the power lines and the positions at which the power lines are arranged may be set as needed.

The first layer 740 may include an insulating portion 741 and a shielding portion 742. In an embodiment of the present invention, the shielding portion 742 may be adjacent to the insulating portion 740 on the left side of the insulating portion 740.

The insulating portion 741 may overlap the data driver DDV. In an embodiment of the present invention, the insulating portion 741 may include an insulating material. For example, the insulating portion 741 may include polyimide ("PI"). However, the insulating material included in the insulating portion 741 is not limited thereto.

The shielding portion 742 may overlap the first and second power lines PL1 and PL2. The shielding portion 742 may shield (or absorb) electromagnetic interference noise ("EMI noise") generated from the first and second power lines PL1 and PL2. In an embodiment of the present invention, the shielding portion 742 may include a conductive material having magnetism and an elastic material having elasticity. For example, the shielding portion 742 may include a metal flake including iron ("Fe") and a polymer. However, the material included in the shielding portion 742 is not limited thereto. For example, the shielding portion 742 may include a material capable of shielding (or absorbing) EMI noise.

The display device 10 according to embodiments of the present invention may include a data driver DDV, at least one power line adjacent to the data driver DDV, and a cover film CF. The cover film CF may cover the data driver DDV and may overlap the at least one power line. In addition, the cover film CF may include at least one shielding portion (or an adhesive layer in which an electromagnetic wave blocking material is embedded). As the shielding portion includes a magnetic conductive material, the cover film CF may shield (or absorb) EMI noise generated from the at least one power line.

While the present invention has been particularly shown and described with reference to embodiments thereof, it will be apparent to those of ordinary skill in the art that various changes in form and detail may be made thereto.

What is claimed is:
1. A display device, comprising:
 a substrate including a display area and a non-display area adjacent to the display area;
 a data driver disposed in the non-display area, and configured to provide a data voltage to the display area;
 a first power line disposed in the non-display area, adjacent to the data driver, and configured to transfer a first power voltage to the display area; and
 a cover film overlapping the data driver and the first power line,
 wherein the cover film includes a first layer including a first shielding portion overlapping the first power line and not overlapping the data driver,
 wherein the first layer further includes an insulating portion laterally adjacent to the first shielding portion and vertically overlapping the data driver,
 wherein the first shielding portion and the insulating portion are made of different materials,
 wherein the insulating portion includes polyimide,
 wherein the first shielding portion includes a conductive material.

2. The display device of claim 1, further comprising:
 a second power line disposed in the non-display area, adjacent to the first power line, and configured to transfer a second power voltage to the display area,
 wherein the first shielding portion further overlaps the second power line.

3. The display device of claim 2, wherein the first power line is disposed between the data driver and the second power line.

4. The display device of claim 2, further comprising:
 a third power line disposed in the non-display area, adjacent to the data driver, and configured to transfer the first power voltage to the display area; and a fourth power line disposed in the non-display area, adjacent to the third power line, and configured to transfer the second power voltage to the display area, wherein the cover film further includes a second shielding portion overlapping the third power line and the fourth power line.

5. The display device of claim 4, wherein the third power line is disposed between the data driver and the fourth power line.

6. The display device of claim 1, wherein the cover film further includes a second layer disposed on the first layer.

7. The display device of claim 6, wherein the second layer includes an insulating material.

8. The display device of claim 1, wherein the cover film further includes a conductive layer disposed on the first layer.

9. The display device of claim 1, wherein the cover film further includes an adhesive layer disposed between the data driver and the first layer.

10. The display device of claim 9, wherein the adhesive layer includes a conductive material.

11. The display device of claim 1, wherein the first shielding portion includes an elastic material.

12. The display device of claim 11, wherein the conductive material is a metal flake including iron, and wherein the elastic material is a polymer.

* * * * *